United States Patent
Sim et al.

(10) Patent No.: US 12,096,191 B2
(45) Date of Patent: Sep. 17, 2024

(54) DEVICE AND METHOD FOR CORRECTING IN-PHASE AND QUADRATURE PHASE BASEBAND COMPONENTS TO DRIVE A SPEAKER

(71) Applicant: MOTOROLA SOLUTIONS, INC., Chicago, IL (US)

(72) Inventors: Moh Lim Sim, Penang (MY); Mohammad Athari Ismail, Penang (MY); Yew Foong Lim, Penang (MY); Chian Hong Wong, Penang (MY); Boon Heng Fong, Penang (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 150 days.

(21) Appl. No.: 17/487,210

(22) Filed: Sep. 28, 2021

(65) Prior Publication Data

US 2023/0100092 A1    Mar. 30, 2023

(51) Int. Cl.
*H04R 3/04* (2006.01)
*G10L 25/03* (2013.01)

(52) U.S. Cl.
CPC .............. *H04R 3/04* (2013.01); *G10L 25/03* (2013.01)

(58) Field of Classification Search
None
See application file for complete search history.

(56) References Cited

U.S. PATENT DOCUMENTS

| 8,477,889 B2* | 7/2013 | Balakrishnan | H03D 1/04 |
| | | | 375/348 |
| 9,503,139 B2 | 11/2016 | Chen et al. | |
| 9,686,103 B2 | 6/2017 | Chen et al. | |
| 10,536,311 B2* | 1/2020 | Ooyama | H04L 27/14 |
| 2007/0291883 A1* | 12/2007 | Welz | H04B 1/30 |
| | | | 375/350 |
| 2018/0241606 A1 | 8/2018 | Li et al. | |
| 2021/0297303 A1* | 9/2021 | Jiang | H04L 27/364 |

* cited by examiner

*Primary Examiner* — Patrick C Chen
(74) *Attorney, Agent, or Firm* — PERRY + CURRIER, INC.

(57) ABSTRACT

A device and method for correcting in-phase and quadrature phase (IQ) baseband components to drive a speaker is provided. The device: controls a local oscillator of an RF downmixing device to a plurality of baseband frequency offsets over a range that includes a given baseband frequency offset; determines, at the plurality of baseband frequency offsets, for a received RF signal, amplitude ratio error and phase error for respective IQ baseband components of the received RF signal; generates, using the amplitude ratio error and the phase error for the respective IQ baseband components, for the given offset, filter coefficients for a given baseband frequency range which compensates for respective amplitude ratio error and respective phase error for the given baseband frequency range; and filters, with the filter coefficients, IQ baseband components of the received RF signal, with the local oscillator operating at the given offset, to generate corrected IQ baseband components.

19 Claims, 4 Drawing Sheets

DEVICE AND METHOD FOR CORRECTING IN-PHASE AND QUADRATURE PHASE BASEBAND COMPONENTS TO DRIVE A SPEAKER

BACKGROUND OF THE INVENTION

Radios which receive radio-frequency signals generally convert such signals to in-phase and quadrature phase (IQ) baseband components, however signals of the RF signals which interfere with a carrier signal may cause errors in the IQ baseband components.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Radios which receive radio-frequency (RF) signals generally convert such signals to in-phase and quadrature phase (IQ) baseband components, however signals of the RF signals which interfere with a carrier signal may cause errors in the IQ baseband components. For example, during conversion of an RF signal to IQ baseband components, energy from an interfering signal may leak into a frequency range of the carrier signal. While the amplitudes of the in-phase and quadrature phase baseband components should be the same, and the phases of such in-phase and quadrature phase baseband components should be 90° out of phase, leakage from an interfering signal may cause the amplitudes to be different and the phases to be different from 90° out of phase, for example when the IQ baseband components are amplified and/or filtered. Thus, there exists a need for an improved technical method, device, and system for correcting in-phase and quadrature phase baseband components to drive a speaker.

Hence, provided herein is a device and method for correcting in-phase and quadrature phase baseband components to drive a speaker. In particular, an RF signal (which may be in a MHz range) received at an RF receiver is converted to in-phase and quadrature phase baseband components using a local oscillator of a downmixing device, for example at a frequency offset relative (which may be in a kHz range) to an initial reference RF frequency (which may be in a MHz range) of the local oscillator. For example, the frequency offset, which may be positive or negative, is added to the reference frequency of the local oscillator, and a resulting total reference frequency is subtracted from frequencies of the RF signal to convert the received RF signal from relatively high frequencies (e.g. in a MHz range) to relatively low frequencies (e.g. in a kHz range), as described in more detail below. Frequencies of the received RF signal, once converted, may be referred to as baseband frequencies and/or as being in a baseband frequency range. As such, frequency offsets as described herein may be interchangeably referred to as baseband frequency offsets.

In particular, the received RF signal may comprise both a carrier signal and interfering signals. A frequency offset of the local oscillator may be selected such that, once the received RF signal is converted to a baseband frequency range, the carrier signal and an interfering signal are at opposite polarities (e.g. on either side of a 0 Hz base band frequency which may correspond to the total reference frequency of the local oscillator). However, when practically implemented, such a scheme causes energy leakage from such an interfering signal into a region of the carrier signal in the baseband frequency range, which may cause an amplitude ratio error of in-phase and quadrature phase baseband components for the carrier signal to differ from "1" (e.g. they may have different amplitudes when the amplitudes should be the same).

Similarly, such energy leakage may cause a phase difference of the in-phase and quadrature phase baseband components to differ from 90° (e.g. they may have phases which are not 90° out of phase when they should be 90° out of phase); put another way, a phase error between the in-phase and quadrature phase baseband components may differ from "0°", when such a phase error should be "0°" (e.g. the phase error represents differences from 90°).

In general, such a technical problem may be solved using a filter and/or equalizer which uses filter coefficients to compensate for respective amplitude ratio error and respective phase error for a given baseband frequency range for example that includes frequencies of the carrier signal and the interfering signal (and any leakage components thereof). While such filter coefficients may be determined at an operating baseband frequency offset of the local oscillator, such filter coefficients may be more accurate when amplitude ratio error and the phase error are determined at a plurality of baseband frequency offsets. For example, functions for the amplitude ratio error and the phase error may be generated that depend on the baseband frequency offsets, and the like.

Hence, a device that includes an RF receiver is provided herein, and is generally configured to control a local oscillator of an RF downmixing device to a plurality of baseband frequency offsets over a range that includes a given baseband frequency offset, such as an operating baseband frequency offset (e.g. at which the device "normally" operates). The device determines, at the plurality of baseband frequency offsets, for a received RF signal, amplitude ratio error and phase error for respective in-phase and quadrature phase (IQ) baseband components of the received RF signal and generates, using the amplitude ratio error and phase error at the plurality of baseband frequency offsets, filter coefficients for a given baseband frequency range which compensates for respective amplitude ratio error and respective phase error for the given baseband frequency range, for example determined using the given baseband frequency offset (e.g. the operating baseband frequency offset).

Put another way, the amplitude ratio error and phase error may be determined as functions of the baseband frequency offsets over a range that includes the operating baseband frequency offset (e.g. a baseband frequency offset used by the local oscillator during "normal" operation of the RF receiver), and the operating baseband frequency offset may be input into the functions to determine the amplitude ratio error and phase error at the operating baseband frequency offset, which may be used to determine the filter coefficients. Such functions may be linear and/or a single order polynomial when determined using two baseband frequency offsets, and/or such functions may be of a higher order polynomial (e.g. "2" or higher than) when determined using three or more baseband frequency offsets.

Hence, a local oscillator of an RF downmixing device, as provided herein, is adapted to be controlled to different baseband frequency offsets.

Furthermore, the filter coefficients may be used to filter the IQ baseband components to generate corrected IQ baseband components, which are processed to generate output to drive a speaker, for example of the device that includes the RF receiver.

An aspect of the present specification provides a method comprising: controlling, using one or more processors of a radio-frequency (RF) receiver, a local oscillator of an RF downmixing device to a plurality of baseband frequency offsets over a range that includes a given baseband frequency offset; determining, using the one or more processors, at the plurality of baseband frequency offsets, for a received RF signal, amplitude ratio error and phase error for respective in-phase and quadrature phase (IQ) baseband components of the received RF signal; generating, using the one or more processors, using the amplitude ratio error and the phase error for the respective IQ baseband components, for the given baseband frequency offset, filter coefficients for a given baseband frequency range which compensates for respective amplitude ratio error and respective phase error for the given baseband frequency range; and filtering, using the one or more processors, with the filter coefficients, IQ baseband components of the received RF signal, with the local oscillator operating at the given baseband frequency offset, to generate corrected IQ baseband components.

Another aspect of the present specification provides a device comprising: an RF receiver configured to receive radio-frequency (RF) signals; an RF downmixing device; a local oscillator of the RF downmixing device; and one or more processors configured to: control the local oscillator of the RF downmixing device to a plurality of baseband frequency offsets over a range that includes a given baseband frequency offset; determine, at the plurality of baseband frequency offsets, for a received RF signal, amplitude ratio error and phase error for respective in-phase and quadrature phase (IQ) baseband components of the received RF signal; generate, using the amplitude ratio error and the phase error for the respective IQ baseband components, for the given baseband frequency offset, filter coefficients for a given baseband frequency range which compensates for respective amplitude ratio error and respective phase error for the given baseband frequency range; and filter, with the filter coefficients, IQ baseband components of the received RF signal, with the local oscillator operating at the given baseband frequency offset, to generate corrected IQ baseband components.

Each of the above-mentioned aspects will be discussed in more detail below, starting with example system and device architectures of the system in which the embodiments may be practiced, followed by an illustration of processing blocks for achieving an improved technical method, device, and system for correcting in-phase and quadrature phase baseband components to drive a speaker.

Example embodiments are herein described with reference to flowchart illustrations and/or block diagrams of methods, apparatus (systems) and computer program products according to example embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a special purpose and unique machine, such that the instructions, which execute via the processor of the computer or other programmable data processing apparatus, create means for implementing the functions/acts specified in the flowchart and/or block diagram block or blocks. The methods and processes set forth herein need not, in some embodiments, be performed in the exact sequence as shown and likewise various blocks may be performed in parallel rather than in sequence. Accordingly, the elements of methods and processes are referred to herein as "blocks" rather than "steps."

These computer program instructions may also be stored in a computer-readable memory that can direct a computer or other programmable data processing apparatus to function in a particular manner, such that the instructions stored in the computer-readable memory produce an article of manufacture including instructions, which implement the function/act specified in the flowchart and/or block diagram block or blocks.

The computer program instructions may also be loaded onto a computer or other programmable data processing apparatus that may be on or off-premises, or may be accessed via the cloud in any of a software as a service (SaaS), platform as a service (PaaS), or infrastructure as a service (IaaS) architecture so as to cause a series of operational blocks to be performed on the computer or other programmable apparatus to produce a computer implemented process such that the instructions, which execute on the computer or other programmable apparatus provide blocks for implementing the functions/acts specified in the flowchart and/or block diagram block or blocks. It is contemplated that any part of any aspect or embodiment discussed in this specification can be implemented or combined with any part of any other aspect or embodiment discussed in this specification.

Further advantages and features consistent with this disclosure will be set forth in the following detailed description, with reference to the drawings.

Figure 1:
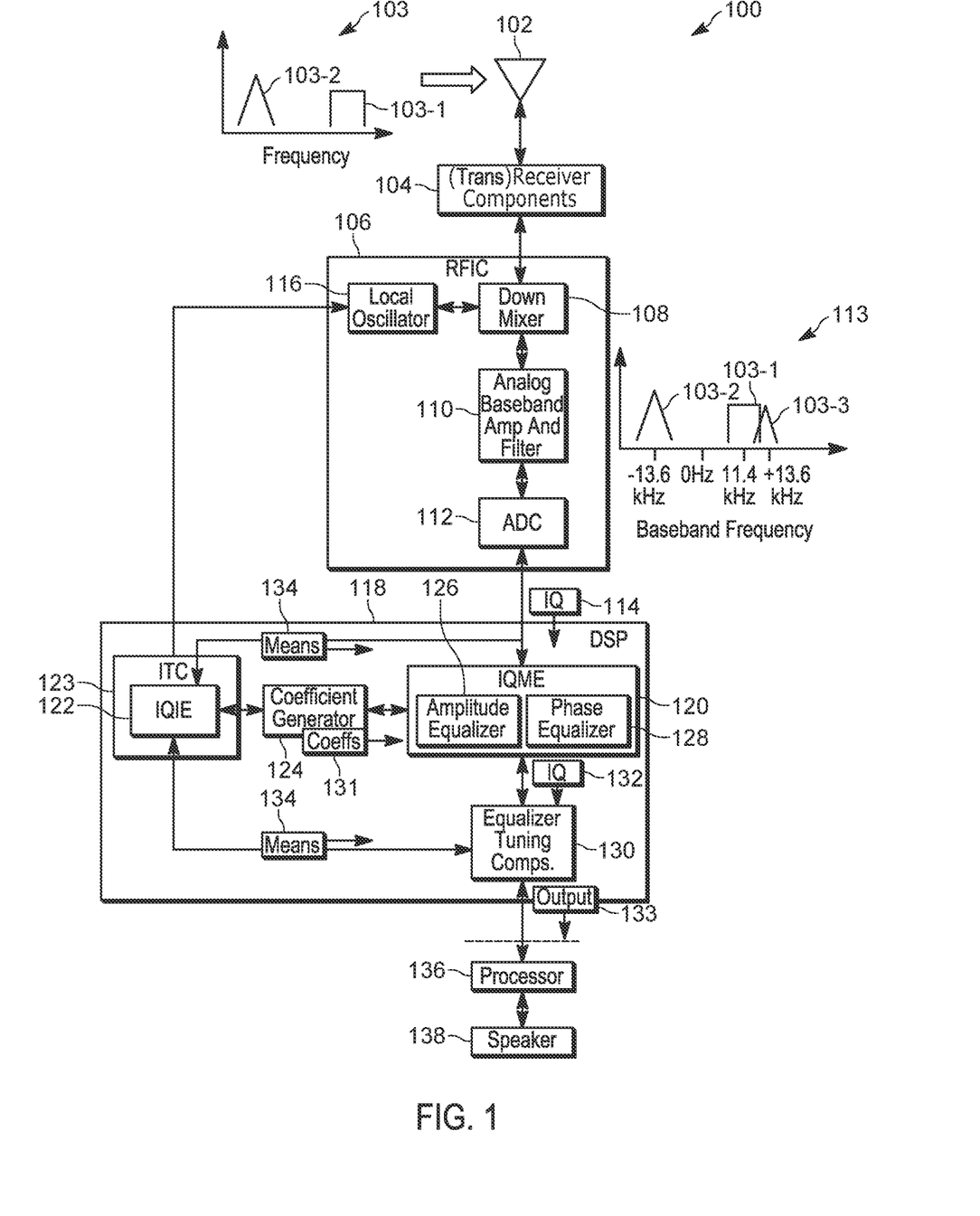
FIG. 1 is a system for correcting in-phase and quadrature phase baseband components to drive a speaker, in accordance with some examples.

Attention is directed to FIG. 1, which depicts an example device 100 for correcting in-phase and quadrature phase baseband components to drive a speaker. The various components of the device 100 are in communication (e.g. coupled together) via any suitable combination of communication links, and communication links between components of the device 100 are depicted in FIG. 1, and throughout the present specification, as double-ended arrows between respective components. Such double-ended arrows between respective components may further indicate that such components are communicatively coupled to one another.

The device 100 may generally comprise a radio-frequency receiver of a two-way radio and/or a communication device and/or mobile communication device, and the like, which may be used by first responders, public safety officers, and the like to respond to emergency incidents, public safety incidents and/or for general communication. However, the device 100 may be incorporated into any suitable device, used by any suitable user.

As depicted, the device 100 comprises an antenna 102 which receives an RF signal 103. For clarity, the RF signal 103 is depicted in a graph format to show that the RF signal 103 may consist of two components: a carrier signal 103-1, and an interfering signal 103-2. To distinguish between the carrier signal 103-1 and the interfering signal 103-2, the carrier signal 103-1 is depicted in a rectangular format and the interfering signal 103-2 is depicted in a triangular format, however such a depiction is not meant to indicate actual shapes and/or envelopes thereof. However, it is further understood that the carrier signal 103-1, and the interfering signal 103-2 are furthermore spread over a range of frequencies, for example as defined by an envelope and/or shape thereof.

As depicted, the carrier signal 103-1 is at a higher frequency than the interfering signal 103-2, however in other examples, the interfering signal 103-2 may be at a higher frequency than the carrier signal 103-1. Indeed, the interfering signal 103-2 may be one of a plurality of interfering signals that are spaced at about equal frequency intervals from the carrier signal 103-1, for example at about 25 kHz intervals). For example, the interfering signals may be harmonics, and the like, of the carrier signal 103-1. Hence, as depicted, the interfering signal 103-2 may be about 25 kHz below the carrier signal 103-1, though both may be in a MHz frequency range. In particular, the interfering signal 103-2 may one of two adjacent channel interferer signals (e.g. one that is 25 kHz below the carrier signal 103-1 and another, not depicted, that is 25 kHz above the carrier signal 103-1). Further details of the RF signal 103 are described in more detail below.

As depicted, the device 100 further comprises receiver components 104 to facilitate receipt of the received RF signal 103. It is further understood that while the device 100 is described herein with respect to receiving an RF signal, it is understood that the device 100 may be further configured to transmit RF signals such that the receiver components 104 may be components of a transceiver, and the like, which may both receive and transmit RF signals. However, hereafter, unless otherwise indicated, it is understood that an RF signal is received at the device 100 and components and/or processes described herein are directed towards the received RF signal 103.

In particular, the received RF signal 103, received at the device 100, may have audio information encoded therein in the carrier signal 103-1, for example in voice and/or audio communications between first responders and the like. While details of the receiver components 104 are not depicted, such receiver components 104 may include, but are not limited to, any suitable combination of switches, attenuators, amplifiers, filters, baluns (balancing units), and the like.

As depicted, the device 100 further comprises an RF integrated circuit (RFIC) 106. In general, the RF signal 103 is received at the antenna 102 and filtered and/or amplified by the receiver components 104 and provided to components of the RFIC 106, which are described hereafter; however, while such components are described with respect to the RFIC 106, such components may be provided in any suitable manner (e.g. at separate integrated circuits and the like).

For example, the device 100 includes an RF downmixing device 108, an analog baseband amplifier and filter 110, an analog to digital converter (ADC) 112, and a local oscillator 116 coupled to the RF downmixing device 108. In some examples the local oscillator 116 may be incorporated with the RF downmixing device 108, while in other examples the local oscillator 116 may be external to the RF downmixing device 108; hence, the local oscillator 116 may be referred to as being of the RF downmixing device 108 and/or the local oscillator 116 may be referred to as being associated with the RF downmixing device 108.

In general, the RF downmixing device 108 mixes the received RF signal 103 with a total reference frequency (e.g. an RF frequency) from the local oscillator 116 to convert frequencies of the received RF signal 103 from a higher frequency range to a lower frequency range, for example from a MHz frequency range to a kHz frequency range. For example, to perform the conversion, the total reference frequency of the local oscillator 116 may be subtracted from the received RF signal 103. The lower frequency range is referred to hereafter as a baseband frequency range. Furthermore, the components of the RFIC 106 generally convert the received RF signal 103 to in-phase and quadrature phase (IQ) baseband components in the baseband frequency range.

The total reference frequency of the local oscillator 116 is generally selected to be at an RF frequency "close" to frequencies of the carrier signal 103-1 of the received RF signal 103, but differing by an offset which may be referred to as a baseband frequency offset. In particular, an initial reference signal of the local oscillator 116 may be at a frequency that is the same as a carrier signal frequency. In particular examples, carrier signal frequency may be 900 MHz, and hence the initial reference signal of the local oscillator 116 may also be at 900 MHz. The baseband frequency offset of the local oscillator 116 may be selected to be negative and of a value selected such that the total reference signal of the local oscillator 116 is at a frequency between the carrier signal 103-1 and the interfering signal 103-2. Hence, as described in more detail below, in these examples, in the baseband frequency range, the carrier signal 103-1 is at a frequency of a positive value that corresponds to an absolute of the baseband frequency offset, and the interfering signal 103-2 is at a frequency of a negative value that is at a given frequency interval (e.g. 25 kHz) below the carrier signal 103-1.

While also not depicted, the reference signal from the local oscillator 116 is understood to be phase shifted by 90° before being added to the quadrature path; for the in-phase path, the reference signal is not shifted such that the in-phase path and the quadrature path are out of phase by 90°. As such, the output from the RF downmixing device 108 includes an in-phase component and a quadrature component which are ideally out of phase by 90° and generally have same and/or similar amplitudes. Hereafter, such components are interchangeably referred to as the IQ baseband components 114.

Furthermore, as described above, the frequency range of the IQ baseband components 114 are understood to be in the baseband frequency range. In a particular example, the carrier signal 103-1 may be centered at a frequency of about 900 MHz and the initial reference frequency of the local oscillator 116 may also be 900 MHz; a baseband frequency offset of the local oscillator 116 may be selected to be −11.4 kHz such that the total reference frequency of the local oscillator 116 may be 899.9886 MHz (e.g. 900 MHz+(−11.4 kHz)=899.9886 MHz). Indeed, in these examples, a baseband frequency offset of the local oscillator 116 of −11.4 kHz may comprise an operating baseband frequency offset at which the device 100 may function during "normal" operation.

As such, to convert the carrier signal 103-1 and the interfering signal 103-2 to the baseband frequency range, the RF downmixing device 108 subtracts 899.9886 MHz from the frequencies of the received RF signal, such that the IQ baseband components 114 include frequencies in a kHz range, including frequencies centered at about 11.4 kHz (e.g. 900 MHz (e.g. of the carrier signal 103-1) minus 899.9886 MHz (e.g. the total reference signal of the local oscillator 116)). Such lower frequencies may be easier for the device 100 to process (e.g. use fewer processing resources), for example to convert to output which may be used to drive a speaker. As such, it is understood that the device 100 may comprise a Very Low Intermediate Frequency (VLIF) receiver.

As has been previously described, it is understood that the received RF signal 103 may include adjacent channel interferer signals, such as the interfering signal 103-2, which (e.g., continuing with the above example) may be centered at about 25 kHz below than the 900 MHz carrier signal, or at about 899.9750 MHz. As such, the IQ baseband components may also include frequencies centered at about −13.6 kHz (e.g. 899.9750 MHz minus 899.9886 MHz). However, while examples provided herein are described with respect to specific frequencies, present examples may be adapted for any suitable frequencies. Furthermore, there may be a plurality of interfering signals 103-2 at periodic intervals, such as at 25 kHz intervals, though a nearest interfering signal 103-2 to the carrier signal 103-1, that is of an opposite polarity in the baseband frequency range, may cause the most interference with the carrier signal 103-1 when the IQ baseband components 114 are generated. As understood herein, the term "polarity" refers to whether a given frequency of the carrier signal 103-1 or the interfering signal 103-2 has a positive or negative value in the baseband frequency range, with a positive frequency having a positive polarity and a negative frequency having a negative polarity; furthermore, the carrier signal 103-1 or the interfering signal 103-2 may be referred as having a positive polarity or a negative polarity on the basis of a respective given frequency on which the carrier signal 103-1 or the interfering signal 103-2 are centered.

As such, it is understood that techniques described herein may be with respect to such a nearest interfering signal 103-2 of an opposite polarity to the carrier signal 103-1 in the baseband frequency range. For example, when the baseband frequency offset is positive, such that the carrier signal 103-1 in the baseband frequency range is negative, the nearest interfering signal 103-2 that causes the most interference may be at a frequency the baseband frequency range is positive (e.g. 25 kHz above a frequency of the carrier signal 103-1).

Hence, it is further understood that a carrier signal may be at any suitable frequency, an interfering signal may be at any suitable frequency (e.g. but may comprise an adjacent and/or nearest channel interferer signal, adjacent and/or nearest to the carrier signal that is of an opposite polarity as the carrier signal in the baseband frequency range), and the total reference signal of the local oscillator 116 may be changed and/or controlled accordingly to be between respective frequencies of a carrier signal and an interferer signal, for example by controlling a baseband frequency offset of the local oscillator 116.

As depicted, the analog baseband amplifier and filter 110 (e.g. which may include, not depicted, respective filters for each of the IQ baseband components) generally filters the IQ baseband components 114; for example, the analog baseband amplifier and filter 110 may include a band pass filter. The ADC 112 may digitize the IQ baseband components 114 at a sampling frequency Fs. However, a practical realization of the RFIC 106 generally leads to the IQ baseband components 114, that are output by the RFIC 106, having different amplitudes and further leads to the IQ baseband components 114 having phases that are out of phase by a value different from 90°, which generally leads to errors in output used to drive a speaker.

For example, this situation is graphically illustrated in FIG. 1 in a graph 113 which shows the carrier signal 103-1 and the interfering signal 103-2 partly processed by the components of the RFIC 106 to show that the signals 103-1, 103-2 are shifted to baseband frequencies, above and below 0 Hz (e.g. which may correspond to a frequency of the total reference signal of the local oscillator 116).

In particular, continuing with the example where the carrier frequency of the carrier signal 103-1 is 900 MHz, the reference signal of the local oscillator 116 is also 900 MHz, and the baseband frequency offset is −11.4 kHz such that a total reference signal of the local oscillator 116 is 899.9886 MHz, the carrier signal 103-1 may now be shifted to 11.4 kHz, while the interfering signal 103-2 may be shifted to −13.6 kHz.

The graph 113 also shows that energy of the interfering signal 103-2 has leaked to the region of the carrier signal 103-1; for example, as also depicted at the graph 113, a leakage component 103-3 (e.g. of the interfering signal 103-2, the leakage component 103-3 also depicted in a triangular format) is located at a frequency that is adjacent to the carrier signal 103-1 and the a leakage component 103-3 generally overlaps with the carrier signal 103-1. In general, the leakage component 103-3 is understood to be at a same absolute baseband frequency as the interfering signal 103-2, but at an opposite polarity value thereof (e.g., as depicted at the graph 113, the leakage component 103-3 has a positive polarity as the interfering signal 103-2 has a negative polarity in the graph 113). Hence, for example, when the interfering signal 103-2 is at −13.6 kHz, the leakage component 103-3 is at +13.6 kHz.

In general, the leakage component 103-3 may be due to error introduced when converting the RF signal 103 into the IQ baseband components 114 and the leakage component 103-3 is representative of that portion of the IQ baseband components 114 of the interfering signal 103-2 that have different amplitudes and/or are not 90° out of phase.

It is understood, however, that the graph 113 is merely provided to show how the interfering signal 103-2 may cause error in the IQ baseband components 114 of the carrier signal 103-1 and the RF signal 103 may not be specifically processed into the form shown in the graph 113.

Regardless, IQ baseband components 114 output by the components of the RFIC 106 may generally have errors due to the aforementioned energy leakage.

Such energy leakage from the interfering signal 103-2 may generally lead to unwanted artefacts in sound emitted by a speaker (e.g. muddled sound, buzzing, and the like, due to the leakage component 103-3 that is adjacent to, and/or overlaps with, the carrier signal 103-1). When the device 100 (and/or a communication device into which the device 100 is integrated) is used by first responders, public safety officers, and the like, such artefacts in sound may lead to miscommunications therebetween and hence may lead to an emergency incident being exacerbated.

As such, the device 100 further includes a digital signal processor (DSP) 118 which, as depicted, includes various engines in the form of an IQ mismatch equalizer (IQME) 120, an IQ imbalance estimator (IQIE) 122, an IQME tuning controller (ITC) 123 (e.g. of which the IQME 120 may be a component), an IQ mismatch equalizer (IQME) 120 and a coefficient generator 124. The IQME 120 further includes an amplitude equalizer 126 and a phase equalizer 128, which may also be provided in the form of engines. As depicted, the DSP 118 further includes equalizer tuning components 130, which may also be provided in the form of engines.

As used herein, the term "engine" refers to hardware (e.g. the DSP 118 implemented as an ASIC, an FPGA, a PAL, a PLA, a PLD etc.), and/or a combination of hardware and software (e.g. a combination of hardware and software includes software hosted at hardware, such as a software module that is stored at a processor-readable memory implemented or interpreted by a processor), or hardware and software hosted at hardware.

However, while a particular structure of the engines of the DSP 118 are depicted, functionality of the DSP 118 may be provided in any suitable manner and/or using a plurality of processors. Furthermore, the DSP 118 may not specifically be a digital signal processor, but may comprise any suitable type of processor and/or plurality of processors.

As depicted, the ADC 112 is in communication with the IQME 120 such that the IQME 120 receives, from the ADC 112, the IQ baseband components (e.g. as digitized by the ADC 112). However, as depicted, the IQIE 122 may also be in communication with the ADC 112 such that the IQIE 122 may also receive the IQ baseband components 114 from the ADC 112 and/or such that the IQIE 122 may sample the IQ baseband components 114 (e.g. at a sampling frequency Fs).

In general, the IQIE 122 measures, for the IQ baseband components 114 received at the IQIE 122, amplitude ratio error and phase error over a given baseband frequency range that corresponds to frequencies of the carrier signals 103-1 and the interfering signal 103-2. The given baseband frequency range may be predetermined and/or preconfigured at the IQIE 122.

As used herein the term "baseband frequencies" is understood to include frequencies of the RF signal 103 determined relative to the total reference frequency of the local oscillator 116.

As used herein, the term "amplitude ratio error" is understood to represent deviations in the respective amplitudes of envelopes the IQ baseband components. For example, a ratio of the amplitudes is ideally "1" and the amplitude ratio error is hence ideally "1". As such, deviations of the amplitude ratio error from "1" represent error in relative amplitudes of the IQ baseband components. In a particular example, when an in-phase component has an amplitude that is 99.5% of the amplitude of the quadrature component, the amplitude ratio error may be understood to be 0.995. Similarly, when the in-phase component has an amplitude that is 102% of the amplitude of the quadrature component, the amplitude ratio error may be understood to be 1.02.

Similarly, as used herein, the term "phase error" is understood to represent deviations in the respective phases of IQ baseband components from 90°. For example, a difference between the phases of the IQ baseband components is ideally 90°, however the phase error may represent deviations from 90°. Put another way, the phase error is ideally "0°", and deviations of the phase error from "0°" represent error in relative phases of the IQ baseband components. In a particular example, when respective phases of the in-phase component and the quadrature components differ by 91°, the phase error may be understood to be 1°. Similarly, when respective phases of the in-phase component and the quadrature components differ by 89°, the phase error may be understood to be −1°. In some examples, however, the phase error may be in form of radians and not degrees.

Examples of amplitude ratio error and phase error (e.g. in radians) are provided below in FIG. 4 and FIG. 5, which generally shows that the amplitude ratio error ratio and phase error may be functions of frequency of the interfering signal 103-2, and the like, for example as a baseband frequency offset of the local oscillator 116 changes. Hence, any correction of the IQ baseband components 114 that are based on measurements of the amplitude ratio error ratio and phase error using a single baseband frequency offset, which, for example, fixes a position of the interfering signal 103-2 and/or the leakage component 103-3 relative to the carrier signal 103-1, are prone to error.

As such, as provided herein, the DSP 118 is generally enabled to control the local oscillator 116 of the RF down-mixing device 108 to a plurality of baseband frequency offsets over a range that includes a given baseband frequency offset, such as an operating baseband frequency offset. For example, as depicted, the ITC 123 may be in communication with the local oscillator 116 and may be configured to control and/or "tune" the local oscillator 116 to different baseband frequency offsets over a range that includes the operating baseband frequency offset.

At each baseband frequency offset to which the local oscillator 116 is controlled, the IQIE 122 determines, for the received RF signal 103, amplitude ratio error and phase error for respective IQ baseband components, for example over a given baseband frequency range that includes baseband frequencies of the carrier signal 103-1 and the interfering signal 103-2 (e.g. and the leakage component 103-3).

In particular, the plurality of baseband frequency offsets to which the local oscillator 116 is controlled, and the given baseband frequency range over which the amplitude ratio error and phase error are determined, may be predetermined and preconfigured, respectively, at the ITC 123 and the IQIE 122. For example, as in general, as a baseband frequency offset of the local oscillator 116 is generally known, the plurality of baseband frequency offsets to the local oscillator 116 is controlled may be preconfigured at the ITC 123. Similarly, as in general, a range of frequencies of the received RF signal 103 is generally known, the given baseband frequency range over which the amplitude ratio error and phase error are determined may be selected to correspond with such baseband frequencies and may be preconfigured at the IQIE 122.

Hence continuing with the above examples, when the operating baseband frequency offset is −11.4 kHz, the ITC 123 may control the local oscillator 116 to different baseband frequency offsets at 2 kHz above and below −11.4 kHz or between −9.4 kHz and −13.4 kHz (e.g. −11.4 kHz+/2 kHz) such that the interfering signal 103-2 shifts to, respectively, −15.6 kHz and −11.6 kHz (e.g. −13.6 kHz−/+2 kHz), and such that the leakage component 103-3 respectively shifts to +15.6 kHz and +11.6 kHz. It is understood that the carrier signal 103-1 also shifts accordingly by +/−2 kHz, in a same respective direction as the interfering signal 103-2 but the leakage component 103-3 shifts in an opposite direction as the interfering signal 103-2. Hence, the amplitude ratio error and phase error changes as the baseband frequency offset changes. Examples of such shifts are described in more detail with respect to FIG. 3.

In examples where the amplitude ratio error ratio and phase error are determined for two baseband frequency offsets, a linear regression may be used to model behavior of the amplitude ratio error ratio and phase error, for example to determine a linear function and/or a polynomial of order "1". In examples where the amplitude ratio error ratio and phase error are for more than two baseband frequency offsets, a polynomial of order "2" or more may be used to model behavior of the amplitude ratio error ratio and phase error.

For example, when amplitude ratio error ratios $Aerr_1$ and $Aerr_2$ are measured for two respective baseband frequency offsets (e.g. −13.4 kHz and −9.4 kHz) at which respective baseband frequencies of the interfering signal 103-2 are at baseband frequencies $f_1$ and $f_2$ (e.g. −11.6 kHz and −15.6 kHz), a slope and/or gradient of the amplitude ratio error may be determined using:

$$dAerr/df = (Aerr_2 - Aerr_1)/(f_2 - f_1).  \quad \text{Equation (1)}$$

It is understood that, alternatively, $f_1$ and $f_2$ may be replaced in Equation (1) by respective baseband frequency offsets a difference therebetween will the same as the difference between frequencies $f_1$ and $f_2$.

In some examples, a mean of the amplitude ratio error (also referred to hereafter as the mean <Aerr>) may be determined using:

$$<Aerr> = (Aerr_2 + Aerr_1)/2 \quad \text{Equation (2)}$$

Similarly, when phase errors $Perr_1$ and $Perr_2$ are measured for two respective baseband frequency offsets (e.g. −13.4 kHz and −9.4 kHz) at which respective baseband frequencies of the interfering signal 103-2 are at baseband frequencies $f_1$ and $f_2$ (e.g. −11.6 kHz and −15.6 kHz), a slope and/or gradient of the phase error may be determined using:

$$dPerr/df = (Perr_2 - Perr_1)/(f_2 - f_1) \quad \text{Equation (3)}$$

It is understood that, alternatively, $f_1$ and $f_2$ may be replaced in Equation (3) by respective baseband frequency offsets a difference therebetween will the same as the difference between frequencies $f_1$ and $f_2$.

In some examples, a mean of the phase error (also referred to hereafter as the mean <Perr>) may be determined using:

$$<Perr> = (Perr_2 + Perr_1)/2 \quad \text{Equation (4)}$$

Use of the means of the amplitude ratio error and the phase error are described in more detail below.

While such examples assume that the interfering signal 103-2 is at a lower frequency than the carrier signal 103-1, in other examples the interfering signal 103-2 may be at a higher frequency than the carrier signal 103-1 as has been previously described. In such examples, the baseband frequencies $f_1$ and $f_2$ for which the amplitude ratio errors and phase errors are measured may be positive (e.g. and/or the corresponding baseband frequency offsets may be positive).

Regardless, the amplitude ratio error and phase error in Equation (1), Equation (2), Equation (3) and Equation (4), are understood to be measured over a given baseband frequency range as has previously been described.

In some examples, measurement of the amplitude ratio error and phase error over the aforementioned given baseband frequency range may be performed in a factory setting, for example by providing, to the device 100, an RF signal with spectral content covering an entirety of a given desired receiving band (e.g. a range of frequencies over which the device 100 is generally configured to operate in the field, the range including frequencies of the carrier signal 103-1 and the interfering signal 103-2) and/or by providing, to the device 100 an RF signal including content in the region of the carrier signal 103-1, and the RF signal further including the interfering signal 103-2.

Alternatively, determination of the amplitude ratio error and phase error, for different baseband frequency offsets, over a given baseband frequency range, may be performed in the "field" and/or when the device 100 is in use and receiving "real" RF signals, as opposed to RF signals received in a factory setting.

Regardless of setting, to measure the amplitude ratio error and phase error over the baseband frequency range, the DSP 118 and/or the ITC 123 controls local oscillator 116 to a plurality of baseband frequency offsets over a range that includes a given baseband frequency offset, and the IQIE 122 determines measurements of the amplitude ratio error and phase error, for the resulting IQ baseband components, over the given baseband frequency range at the plurality of baseband frequency offsets.

Furthermore, the IQIE 122 may provide such determinations of the amplitude ratio error and phase error to the coefficient generator 124. The coefficient generator 124 may generate, using the amplitude ratio error and the phase error for the respective IQ baseband components, for a given baseband frequency offset (e.g. an operating baseband frequency offset), filter coefficients 131 for a given baseband frequency range which compensates for respective amplitude ratio error and respective phase error for the given baseband frequency range.

For example, the IQIE 122 and/or the coefficient generator 124 may implement Equation (1) and Equation (3) to determine the gradients dAerr/df, dPerr/df, and the coefficient generator 124 may use the gradients to determine the filter coefficients 131 at the operating baseband frequency offset.

In examples where filter coefficients 131 are determined in a factory setting, the filter coefficients 131 may be stored at a memory (not depicted) of the device 100 and used to later correct IQ baseband components determined when the device 100 is in the field, for example by using the filter coefficients 131 to compensate for the amplitude ratio error and the phase error of a received RF signal for the operating baseband frequency offset. Similarly, where the filter coefficients 131 are determined periodically (and the like) in the field, the filter coefficients 131 may be stored at the memory of the device 100 and used to correct IQ baseband components until a next determination of the filter coefficients 131.

For example, when the device 100 is in the field, the device 100 may periodically, and the like, enter a coefficient determination mode to determine the filter coefficients 131 to compensate for the amplitude ratio error and the phase error of a received RF signal for the operating baseband frequency offset as described herein. In the coefficient determination mode, the device 100 controls the local oscillator 116 to a plurality of baseband frequency offsets, determines the amplitude ratio error and phase error as described herein, and uses the amplitude ratio error and phase error to determine the filter coefficients 131. Otherwise the device 100 may "normally" operate in a "normal" mode using the operating baseband frequency offset and compensate the IQ baseband components using the filter coefficients 131 determined in the coefficient determination mode. The device 100 may enter the coefficient determination mode under other conditions, for example when power of the carrier signal 103-1 is smaller than a threshold power and/or respective power of the interfering signal 103-2 is greater than a respective threshold power and/or when the interfering signal 103-2 is at a threshold frequency distance from the carrier signal 103-1, as described in further detail below.

The filter coefficients 131 are generally understood to include amplitude filter coefficients to compensate for the amplitude ratio error ratio, and may comprise any suitable filter coefficients which, when applied to the IQ baseband components 114 over at the given baseband frequency range, cause the IQ baseband components 114 to have a common amplitude ratio error ratio of "1" across the given baseband frequency range. Such amplitude filter coefficients may be applied to the IQ baseband components 114 by the amplitude equalizer 126. In general, the amplitude equalizer 126 is understood to perform such filtering over a frequency range that at least includes the given baseband frequency range (e.g. used to determine the amplitude ratio error) and the amplitude filter coefficients are understood to be used for the entire frequency range over which the amplitude equalizer 126 performs filtering.

Similarly, filter coefficients 131 are generally understood to include phase filter coefficients to compensate for the phase error, and may comprise any suitable filter coefficients which, when applied to the IQ baseband components 114 over the given baseband frequency range, cause the IQ baseband components 114 to be out of phase by 90°. Such amplitude filter coefficients may be applied to the IQ baseband components 114 by the phase equalizer 128. In some examples, phase filter coefficients may be in the form of one or more delay times and/or one or more fractional delay times (e.g. a time by which one (or more) of the IQ baseband components 114 may be delayed such that the phase of the IQ baseband components 114 in the give baseband frequency range differ by 90°. Put another way, such delay times and/or fractional delay times, when applied to the IQ baseband components 114 in the given baseband frequency range, cause the IQ baseband components 114 in the given baseband frequency range to have a common phase error of "0". In general, the phase equalizer 128 is understood to perform such filtering over a frequency range that at least includes the given baseband frequency range (e.g. used to determine the phase error) and the phase filter coefficients are understood to be used for the entire frequency range over which the phase equalizer 128 performs filtering.

Hence, the filter coefficients 131 are applied, by the IQME 120, to the IQ baseband components 114 at least over the given baseband frequency range, to correct for, and/or filter out, the aforementioned energy leakage represented by the leakage component 103-3, of the interfering signal 103-2. For example, such correcting and/or filtering may cause the leakage component 103-3 to be removed from a baseband frequency range that corresponds to a location of the carrier signal 103-1. Such a correction causes the IQ baseband components 114, as corrected, to represent the carrier signal 103-1 more accurately, reducing error in processing the carrier signal 103-1.

Put yet another way, the filter coefficients 131 are generally to filter the IQ baseband components 114 (e.g. in the baseband frequency range for which they are determined) such that, respective amplitudes of the IQ baseband components 114 are generally the same and/or similar across a given frequency band where the carrier signal 103-1 and the interfering signal 103-2 are located. In addition, the filter coefficients 131 are generally further to cause respective phases of the IQ baseband components to be 90° out of phase across a given frequency band where the carrier signal 103-1 and the interfering signal 103-2 are located.

It is furthermore understood that the IQME 120 may receive the filter coefficients 131 and use the filter coefficients 131 to filter the IQ baseband components 114, with the local oscillator 116 operating at the given baseband frequency offset for which the filter coefficients 131 were generated (e.g. the operating baseband frequency offset), to generate corrected IQ baseband components 132, and which, as depicted, may further be processed by the equalizer tuning components 130 to generate output 133.

Such corrected IQ baseband components 132 generally correspond to the carrier signal 103-1 (e.g. with the leakage component 103-3 removed) and have same and/or similar amplitudes, and are out of phase by 90° across the given baseband frequency range. In particular, the amplitude equalizer 126 may apply amplitude filter coefficients to the IQ baseband components 114, and the phase equalizer 128 may apply phase filter coefficients to the IQ baseband components 114, to generate the corrected IQ baseband components 132.

The equalizer tuning components 130 may perform any other suitable filtering and/or tuning to assist in generating output 133 based on the corrected IQ baseband components 132, and the like, including, but not limited to: resampling the corrected IQ baseband components 132 to a lower frequency; a removal of a direct current component of the corrected IQ baseband components 132; monitoring of any change in the baseband frequencies over time and applying any suitable IQ imbalance correction (e.g. to correct the baseband frequencies when they change over time, and which may be based on mean amplitude ratio error and/or mean phase error provided by the IQIE 122); discrimination and/or demodulation, and the like.

Indeed, in some examples, the IQIE 122 may further determine mean amplitude ratio error and/or mean phase error, as described above with respect to Equation (2) and Equation (4). Mean amplitude ratio error and/or mean phase error are shown in FIG. 1 as MEANs 134. As depicted, the IQIE 122 may provide the MEANs 134 to the IQME 120 and/or the equalizer tuning components 130 such that the IQME 120 and/or the equalizer tuning components 130 may perform further corrections using the MEANs 134, for example to correct for any change in baseband frequencies over time.

Hence, the equalizer tuning components 130 are understood to process the corrected IQ baseband components 132 to generate output 133 therefrom, which may be provided to a general processor 136 which uses the output 133 to drive a speaker 138. The processor 136 and/or the speaker 138 which may be internal or external to device 100 as represented by the dashed line between the processor 136 and the DSP 118; for example, the processor 136 and/or the speaker 138 may be components of a communication device and/or a mobile communication device into which the device 100 is integrated.

For example, the output 133 from the equalizer tuning components 130 may be added to a stack (e.g. managed by processor 136) for driving the speaker 138.

In general, it is understood that the device 100 may be adapted for communication with one or more communication links and/or communication networks. For example, while the device 100 is described as communicating at a specific frequency range (e.g. that includes a 900 MHz carrier signal), the device 100 may be adapted for communication with one or more of the Internet, a digital mobile radio (DMR) network, a Project 25 (P25) network, a terrestrial trunked radio (TETRA) network, a Bluetooth network, a Wi-Fi network, for example operating in accordance with an IEEE 802.11 standard (e.g., 802.11a, 802.11b, 802.11g), an LTE (Long-Term Evolution) network and/or other types of GSM (Global System for Mobile communications) and/or 3GPP (3rd Generation Partnership Project) networks, a 5G network (e.g., a network architecture compliant with, for example, the 3GPP TS 23 specification series and/or a new radio (NR) air interface compliant with the 3GPP TS 38 specification series) standard), a Worldwide Interoperability for Microwave Access (WiMAX) network, for example operating in accordance with an IEEE 802.16 standard, and/or another similar type of wireless network.

Furthermore, while the device 100 is described as an RF receiver, the device 100 may more generally comprise one or more transceivers which may include, but are not limited to, a cell phone transceiver, a DMR transceiver, P25 transceiver, a TETRA transceiver, a 3GPP transceiver, an LTE transceiver, a GSM transceiver, a 5G transceiver, a Bluetooth transceiver, a Wi-Fi transceiver, a WiMAX transceiver, and/or another similar type of wireless transceiver configurable to communicate via a wireless radio network.

While the DSP 118 is described with respect to engines, it is understood that the DSP 118 may comprise any suitable combination of one or more logic circuits, one or more processors, one or more microprocessors, one or more GPUs (Graphics Processing Units), and/or the DSP 118 may include one or more ASIC (application-specific integrated circuits) and one or more FPGA (field-programmable gate arrays), and/or another electronic device. In some examples, the DSP 118 and/or the device 100 is not a generic processor and/or a generic device, but a device specifically configured to implement functionality for correcting in-phase and quadrature phase baseband components to drive a speaker.

Furthermore, in some examples, the various engines described herein may be distributed among more than one device. For example one or more of the engines may be located at portable radios (e.g., carried by police officers), while other engines may be located at mobile radios in communication with the portable radios (e.g., located at a police car). In some of these examples, the IQ components 114 and/or the corrected IQ components 132 may be routed from a portable radio (e.g. which is receiving the RF signal 103) to a mobile radio (e.g. located at the police car) for processing, as the mobile radio may have better processing power, a larger battery supply, and the like; in such examples, the output 133 may be provided to the speaker 138 which may be located at police car. Hence, any suitable architecture and/or distribution of engines and/or a suitable number of processors implementing the engines is with the scope of the present specification.

While not depicted, the device 100 may further include a non-transitory machine readable medium that stores machine readable instructions to implement one or more programs or applications at the DSP 118 and/or the device 100 in general. Example machine readable media include a non-volatile storage unit (e.g., Erasable Electronic Programmable Read Only Memory ("EEPROM"), Flash Memory) and/or a volatile storage unit (e.g., random-access memory ("RAM")). For example, programming instructions (e.g., machine readable instructions) that implement the functionality of the device 100 as described herein may be maintained, persistently, at a memory and used by the DSP 118 and/or the device 100, which makes appropriate utilization of volatile storage during the execution of such programming instructions which may cause the DSP 118 and/or the device 100, and/or any other suitable combination of processors, to implement the blocks of the method set forth in FIG. 2.

Indeed, in general, it is understood that the DSP 118 and/or the device 100 may be generally enabled to: control a local oscillator of an RF downmixing device to a plurality of baseband frequency offsets over a range that includes a given baseband frequency offset; determine, at the plurality of baseband frequency offsets, for a received RF signal, amplitude ratio error and phase error for respective in-phase and quadrature phase (IQ) baseband components of the received RF signal; generate, using the one or more processors, using the amplitude ratio error and the phase error for the respective IQ baseband components, for the given baseband frequency offset, filter coefficients for a given baseband frequency range which compensates for respective amplitude ratio error and respective phase error for the given baseband frequency range; and filter, with the filter coefficients, IQ baseband components of the received RF signal, with the local oscillator operating at the given baseband frequency offset, to generate corrected IQ baseband components.

Figure 2:
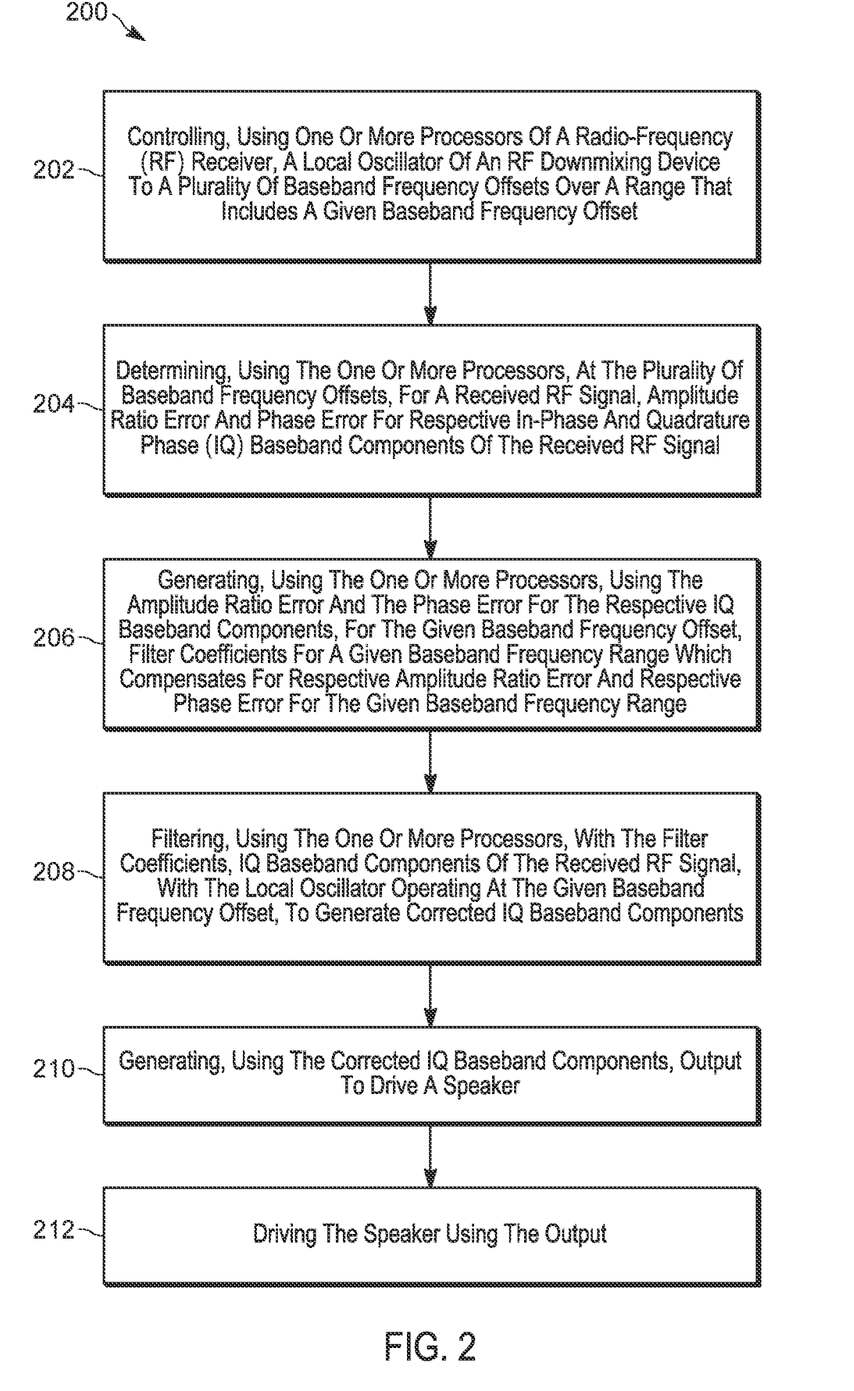
FIG. 2 is a flowchart of a method for correcting in-phase and quadrature phase baseband components to drive a speaker, in accordance with some examples.

Attention is now directed to FIG. 2, which depicts a flowchart representative of a method 200 for correcting in-phase and quadrature phase baseband components to drive a speaker. The operations of the method 200 of FIG. 2 may correspond to machine readable instructions that are executed by the device 100 and/or the DSP 118. The method 200 of FIG. 2 is one way that the device 100 and/or the DSP 118 may be configured. Furthermore, the following discussion of the method 200 of FIG. 2 will lead to a further understanding of the device 100, and its various components.

The method 200 of FIG. 2 need not be performed in the exact sequence as shown and likewise various blocks may be performed in parallel rather than in sequence. However, various blocks may be performed in sequence and repeatedly. Accordingly, the elements of method 200 are referred to herein as "blocks" rather than "steps." The method 200 of FIG. 2 may be implemented on variations of the device 100 of FIG. 1, as well.

At a block 202, the DSP 118 (e.g., and/or any other suitable processor of the device 100, which is understood to comprise a radio-frequency receiver) controls the local oscillator 116 of the RF downmixing device 108 to a plurality of baseband frequency offsets over a range that includes a given baseband frequency offset. Such control is understood to further include the local oscillator 116 generating total reference signals that include an initial reference signal combined with one of the plurality of baseband frequency offsets added thereto.

Furthermore, the given baseband frequency offset may comprise an operating baseband frequency offset of the device 100 (e.g. of a radio-frequency receiver thereof).

At a block 204, the DSP 118 (e.g., and/or any other suitable processor of the device 100, which is understood to comprise a radio-frequency receiver) determines, at the plurality of baseband frequency offsets, for the received RF signal 103, amplitude ratio error and phase error for respective in-phase and quadrature phase (IQ) baseband components of the received RF signal 103. Such a measurement may occur via the IQIE 122. The determination of the amplitude ratio error and phase error is understood to occur for a given baseband frequency range, for example over a baseband frequency range that includes the carrier signal 103-1, the interfering signal 103-2 and the leakage component 103-3.

Put another way, the given baseband frequency range may comprise an operating baseband frequency range that is defined, at least in part, by the operating baseband frequency offset. For example, when the local oscillator 116 is controlled to the operating baseband frequency offset, the carrier signal 103-1, the interfering signal 103-2 and the leakage component 103-3 are at various frequencies relative to each other; the operating baseband frequency range is understood to include the baseband frequencies of the carrier signal 103-1, the interfering signal 103-2 and the leakage component 103-3 when the local oscillator 116 is controlled to the operating baseband frequency offset. However, the given baseband frequency range is understood to comprise any baseband frequencies at which the carrier signal 103-1, the interfering signal 103-2 and the leakage component 103-3 are located, at any of the plurality of baseband frequency offsets to which the local oscillator 116 is controlled at the block 202.

Put another way, the given baseband frequency range is understood to correspond to frequencies of the carrier signal 103-1 and the interfering signal 103-2 of the received RF signal 103 processed (e.g. mixed) to the given baseband frequency range by the RF downmixing device 108 using a reference frequency of the local oscillator 116 and the plurality of baseband frequency offsets.

Furthermore, determining the amplitude ratio error and the phase error may occur by the IQIE 122 and/or determining the amplitude ratio error and the phase error may occur in any suitable manner and/or at any suitable time.

For example, determining the amplitude ratio error and the phase error may occur in a factory setting using a factory provided RF signal. However, determining the amplitude ratio error and the phase error may occur in the field.

Furthermore, determining the amplitude ratio error and the phase error may occur in any suitable manner.

Measurement of the amplitude ratio error and the phase error may occur for two baseband frequencies of the interfering signal 103-2 (e.g. which result from a corresponding two baseband frequency offsets) or at more than two baseband frequencies of the interfering signal 103-2 (e.g. which result from a corresponding more than two baseband frequency offsets) as has been described previously in the present specification.

At a block 206, the DSP 118 (e.g. and/or any other suitable processor of the device 100) generates, using the amplitude ratio error and the phase error for the respective IQ baseband components (e.g. of the plurality of baseband frequency offsets), for the given baseband frequency offset (e.g. the operating frequency baseband offset), the filter coefficients 131 for the given baseband frequency range, the filter coefficients compensating for respective amplitude ratio error and respective phase error for the given baseband frequency range.

For example, as has already been explained, determining the amplitude ratio error and the phase error may occur for two baseband frequency offsets on either side (e.g. at +/−2 kHz) of a given baseband frequency offset, such as the operating baseband frequency offset. Furthermore, using the amplitude ratio error and the phase error at the two baseband frequency offsets, respective linear equations may be determined for the amplitude ratio error and the phase error as represented by Equation (1), Equation (2), Equation (3) and Equation (4) (e.g. using the frequencies $f_1$ and $f_2$ of the interfering signal 103-2 that result at the two baseband frequency offsets). In these examples, the filter coefficients 131 may be generated for the given baseband frequency offset using the respective linear equations.

Put another way, the method 200 may further comprise: determining the amplitude ratio error and the phase error at two baseband frequency offsets on either side of the given baseband frequency offset; using the amplitude ratio error and the phase error at the two baseband frequency offsets to determine respective linear equations for the amplitude ratio error and the phase error; and generating the filter coefficients 131 for the given baseband frequency offset using the respective linear equations.

Put another way, when two or more baseband frequency offsets are used at the block 202, the method 200 may further comprise: determining the amplitude ratio error and the phase error at three or more baseband frequency offsets in the range that includes the given baseband frequency offset; using the amplitude ratio error and the phase error at the three or more baseband frequency offsets to determine respective polynomial equations for the amplitude ratio error and the phase error; and generating the filter coefficients for the given baseband frequency offset using the respective polynomial equations. In particular, when two baseband frequency offsets are used at the block 202, the respective polynomial equations for the amplitude ratio error and the phase error correspond to Equation (1), Equation (2), Equation (3) and Equation (4); otherwise when three or more baseband frequency offsets are used at the block 202, the respective polynomial equations for the amplitude ratio error and the phase error comprise higher order (e.g. "2" or higher) polynomial equations, such as quadratic polynomials, and the like.

At a block 208, the DSP 118 (e.g. and/or any other suitable processor of the device 100) filters, with the filter coefficients 131, the IQ baseband components 114 of the received RF signal 103, with the local oscillator 116 operating at the given baseband frequency offset, to generate the corrected IQ baseband components 132.

At a block 210, the DSP 118 (e.g. and/or any other suitable processor of the device 100) generates, using the corrected IQ baseband components 132, the output 133 to drive the speaker 138. For example, the output 133 is provided to the processor 136.

At a block 212, the processor 136 (e.g. and/or any other suitable processor) drives the speaker 138 using the output 133.

As has already been described, the filter coefficients 131 are to respectively equalize the amplitude ratio error and the phase error of the corrected IQ baseband components 132, for example across the given baseband frequency range. Hence, the method 200 may further comprise correcting the IQ baseband components 114, using the filter coefficients 131, to, for the corrected IQ baseband components 132: set the amplitude ratio error to about"1"; and set the phase error to about "0°".

It is furthermore understood that in some examples, determining the amplitude ratio error and the phase error and generating the filter coefficients 131 may occur in a factory setting and the filter coefficients 131 may be stored at the device 100 to use in filtering the IQ baseband components 114 in the field. In such examples, generating the filter coefficients 131 may comprise a one-time generation and it is assumed in these examples that the filter coefficients 131 may not change with time.

However, in other examples, for example in the field, determining the amplitude ratio error and the phase error and generating the filter coefficients 131 may occur at any suitable time. For example, one or more of determining the amplitude ratio error and the phase error and generating the filter coefficients 131 may occur periodically, such every minute, every 10 minutes and/or at any other suitable periodicity.

In yet further examples, one or more of determining the amplitude ratio error and the phase error and generating the filter coefficients 131 may occur when a power of the carrier signal 103-1 is greater than a threshold power, which may be stored at, and/or programmed at, the IQIE 122. Furthermore, the method 300 may further comprise the DSP 118 (e.g. the IQIE 122) determining when the power of the carrier signal 103-1 is greater than a threshold power and, in response, determining the amplitude ratio error and the phase error and/or generating the filter coefficients 131. Similarly, one or more of determining the amplitude ratio error and the phase error and generating the filter coefficients 131 may occur when a respective power of the interfering signal 103-2 is greater than a respective threshold power, which may be stored at, and/or programmed at, the IQIE 122. Furthermore, the method 200 may further comprise the DSP 118 (e.g. the IQIE 122) determining when the respective power of the interfering signal 103-2 is greater than a respective threshold power and, in response, determining the amplitude ratio error and the phase error and/or generating the filter coefficients 131. The threshold powers to which the carrier signal 103-1 and the interfering signal 103-2 are compared may be the same or different In yet further examples, one or more of determining the amplitude ratio error and the phase error and generating the filter coefficients 131 may occur when both power of the carrier signal 103-1 is smaller than a threshold power, and respective power of the interfering signal 103-2 is greater than a respective threshold power; such threshold powers may be the same or different.

Indeed, any of the above examples (e.g. in which the carrier signal 103-1 or the interfering signal 103-2 being above a threshold power, or in which power of the carrier signal 103-1 is smaller than a threshold power and respective power of the interfering signal 103-2 is greater than a respective threshold power) are generally to determine whether one of the carrier signal 103-1 or the interfering signal 103-2 is dominant at given baseband frequencies, as described in further detail hereafter.

For example, in the case of the power of the carrier signal 103-1 being smaller than a threshold power and respective power of the interfering signal 103-2 being greater than a respective threshold power, power of the carrier signal 103-1 may be compared to a threshold power to determine whether power of the carrier signal 103-1 is smaller than the threshold power as, in some examples, above such a threshold power, estimating the amplitude error and phase error (e.g. as in Equation (1) and Equation (3)) has been heuristically determined to be more susceptible to error when respective power of the interfering signal 103-2 is less than a respective threshold power. Hence, in the examples, respective power of the interfering signal 103-2 may be compared to a respective threshold power to determine whether the interfering signal 103-2 is larger than the respective threshold power as, in some examples, below such a respective threshold power, estimating the amplitude ratio error and phase error (e.g. as in Equation (1) and Equation (3)) has been heuristically determined to be more susceptible to error, when power of the carrier signal 103-1 is greater than a respective threshold power. It is understood that, in these examples, measurement of the amplitude ratio error and phase error may occur for baseband frequency offsets at which respective baseband frequencies of the interfering signal 103-2 are at baseband frequencies $f_1$ and $f_2$, and determination of the power of the interfering signal 103-2 may also occur at these baseband offsets.

Hence, in particular examples estimating the amplitude ratio error and phase error has been heuristically determined to be more susceptible to error when both power of the carrier signal 103-1 is smaller than a threshold power and respective power of the interfering signal 103-2 is greater than a respective threshold power. Furthermore, the threshold power for the carrier signal 103-1 may be smaller than the respective threshold power for the interfering signal 103-2; in particular the threshold power for the carrier signal 103-1 may be about −100 decibel per milliwatt (dBm) and the respective threshold power for the interfering signal 103-2 may be about −40 dBm. However any suitable threshold powers are within the scope of the present specification.

For example, the IQIE 122 may include band pass filters tuned to select portions of the IQ baseband components 114 centered at given baseband frequencies such as baseband frequencies at which the portions of the carrier signal 103-1 and/or the interfering signal 103-2 may be located at one or more of the plurality of baseband frequency offsets (e.g. such as the aforementioned baseband frequencies of −11.6 kHz and −15.6 kHz of the interfering signal 103-2). Furthermore, in some examples, downmixing may occur to shift any suitable component of the RF signal 103 to any suitable baseband frequencies (e.g. such as the aforementioned baseband frequencies of −11.6 kHz and −15.6 kHz of the interfering signal 103-2).

Put another way, the received RF signal 103 comprises a carrier signal 103-1 and an interfering signal 103-2, and one or more of determining the amplitude ratio error and the phase error, and generating the filter coefficients 131 (e.g. at the block 202 and/or the block 204), may occur when power of the carrier signal 103-1 is smaller than a threshold power and respective power of the interfering signal 103-2 is greater than a respective threshold power. Furthermore, the power of one or more of the carrier signal 103-1 and the respective power of the interfering signal 103-2 may be determined at given frequencies using one or more bandpass filters. Such bandpass filters may be components of the IQIE 122 and hence may be represented in FIG. 1 by the IQIE 122. However, such bandpass filters may alternatively be separate from the IQIE 122.

Alternatively, the received RF signal 103 comprises a carrier signal 103-1 and an interfering signal 103-2, and one or more of determining the amplitude ratio error and the phase error, and generating the filter coefficients 131 (e.g. at the block 202 and/or the block 204), may occur when power of the carrier signal 103-1 is greater than a threshold power or respective power of the interfering signal 103-2 is greater than a respective threshold power.

While specific examples of threshold powers of −100 dBm and −40 dBm were mentioned above, threshold powers provided herein may be any suitable given values, such as −50 dBm (e.g. such that one or more of determining the amplitude ratio error and the phase error and generating the filter coefficients may occur when power of the interfering signal 103-2 is greater than −50 dBm) and/or the threshold power may be a ratio over a respective power of the carrier signal 103-1 in terms of dB, such as 60 dB (e.g. such that one or more of determining the amplitude ratio error and the phase error and generating the filter coefficients may occur when an power of the interfering signal 103-2 is 60 dB or greater than a respective power of the carrier signal 103-1). However, any suitable threshold powers are within the scope of the present specification. For example, rather than −50 dBm, the threshold power may be −40 dBm, −30 dBm, −20 dBm or any other suitable values. Similarly, rather than 60 dB of a respective power of the carrier signal 103-1, the threshold power may be 80 dB, 50 dB, or 30 dB of a respective power of the carrier signal 103-1.

However, in other examples, one or more of determining the amplitude ratio error and the phase error and generating the filter coefficients 131 may occur when the interfering signal 103-2 is at a threshold frequency distance from the carrier signal 103-1, which may be stored at, and/or programmed at, the IQIE 122. Furthermore, the method 200 may further comprise the DSP 118 (e.g. the IQIE 122) determining when the interfering signal 103-2 is at a threshold frequency distance from the carrier signal 103-1 and, in response, determining the amplitude ratio error and the phase error and/or generating the filter coefficients 131.

For example, in some examples, the RF signal 103 may include more than one interfering signal 103-2 (e.g. at 25 kHz intervals from the carrier signal 103-1). In these examples, the blocks 204, 206 may occur only when the nearest possible interfering signal 103-2 (e.g. 25 kHz below the carrier signal 103-1) to the carrier signal 103-1 is present, and is of an opposite polarity to the carrier signal 103-1 in the baseband frequency range. The blocks 204, 206 may not occur when such a nearest possible interfering signal 103-2 is neither present nor of opposite polarity to the carrier signal 103-1 in the baseband frequency range. Hence, in examples, where the interfering signals 103-2 may be at 25 kHz intervals, the threshold frequency distance from the carrier signal 103-1 may comprise 25 kHz, however, other threshold frequency distances are within the scope of the present specification.

Put another way, the received RF signal 103 may comprises the carrier signal 103-1 and the interfering signal 103-2, and one or more of determining the amplitude ratio error and the phase error, and generating the filter coefficients 131 may occur, when the interfering signal 103-2, is at a threshold frequency distance from the carrier signal 103-2.

Figure 3:
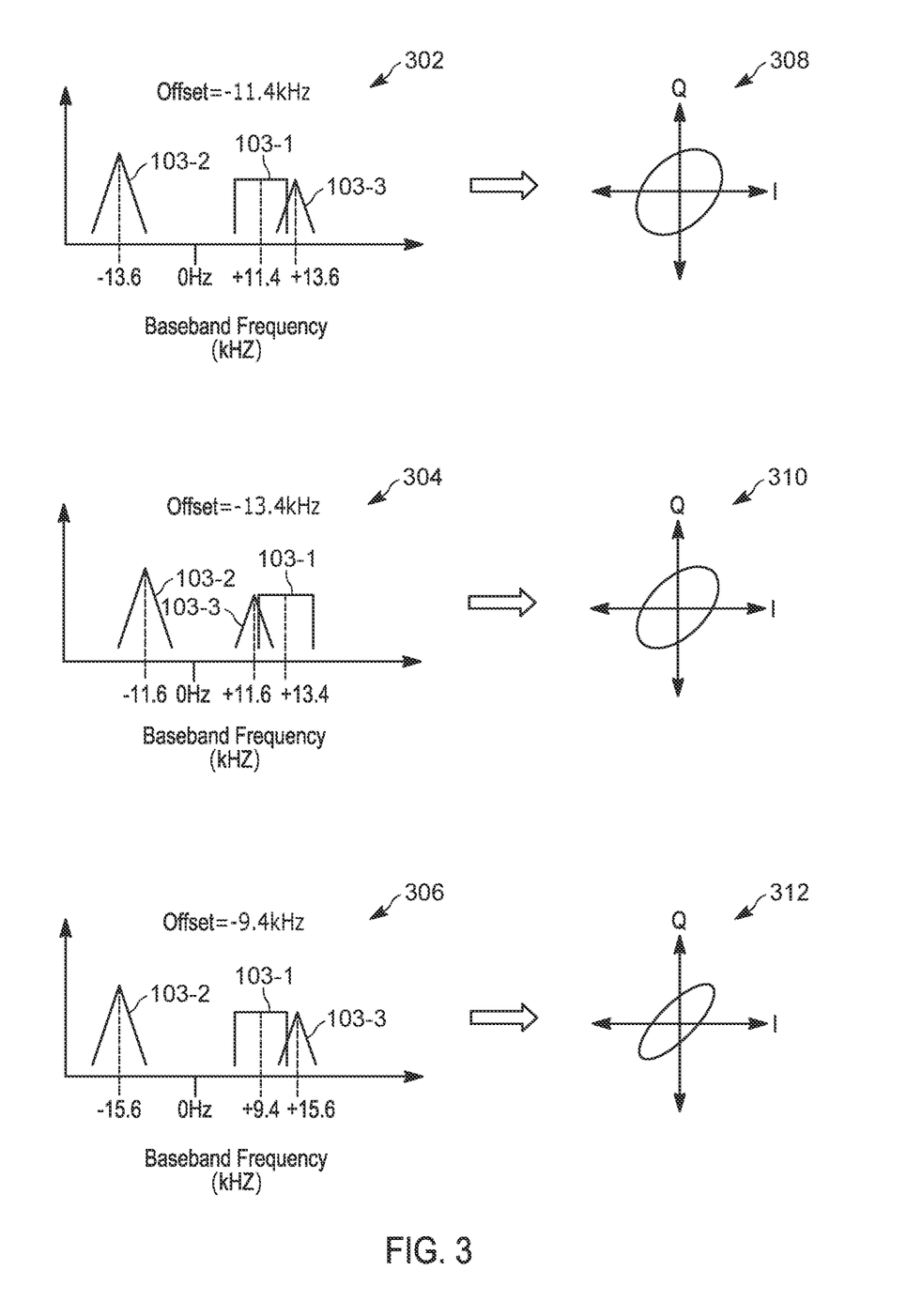
FIG. 3 depicts baseband frequencies of carrier signals, interfering signals and leakage components as baseband frequency offsets change, as well as resulting phasor diagrams of in-phase and quadrature phase baseband components for the baseband frequency offsets, in accordance with some examples.

Attention is next directed to FIG. 3 which depicts graphs 302, 304, 306, that are similar to the graph 113, and show the carrier signal 103-1, the interfering signal 103-2 and the leakage component 103-3 for three baseband frequency offsets: −11.4 kHz, −13.4 kHz and −15.4 kHz, respectively. It is understood in the graphs 302, 304, 306 that the local oscillator 116 is being controlled to the respective baseband frequency offsets, which are added to an initial reference frequency such that a total reference frequency is used by the RF downmixing device 108 to convert the carrier signal 103-1, the interfering signal 103-2 to the baseband frequency range as has been described herein.

At the graphs 302, 304, 306, respective center baseband frequencies of the carrier signal 103-1 are at a frequency corresponding to a positive of the absolute value of the respective baseband frequency offsets. Hence, for the graphs 302, 304, 306 the respective center baseband frequencies of the carrier signal 103-1 are at +11.4 kHz, +13.4 kHz and +9.4 kHz, respectively.

Similarly, respective center baseband frequencies of the interfering signal 103-2 are 25 kHz below the respective center baseband frequencies of the carrier signal 103-1. Hence, for the graphs 302, 304, 306 the respective center baseband frequencies of the interfering signal 103-2 are at −13.6 kHz, −11.6 kHz and −15.6 kHz, respectively. Put another way, as the baseband frequency offset changes, the baseband frequencies of the carrier signal 103-1 and the interfering signal 103-2 change, but they maintain their 25 kHz distance therebetween.

Furthermore, a respective center baseband frequencies of the leakage component 103-3 is at a frequency corresponding to the opposite polarity and the absolute value of the respective center baseband frequencies of the interfering signal 103-2. Hence, for the graphs 302, 304, 306 the respective center baseband frequencies of the leakage component 103-3 are at +13.6 kHz, +11.6 kHz and +15.6 kHz, respectively Comparing the relative frequencies of the carrier signal 103-1 and the leakage component 103-3, and the degree to which they overlap for the graphs 302, 304, 306, it is understood that interference of the leakage component 103-3 with the carrier signal 103-1 changes as the as the baseband frequency offset changes.

For example, also depicted in FIG. 3 are graphs 308, 310, 312 which show examples of how the IQ baseband components 114 may change as the as the baseband frequency offset changes. The graphs 308, 310, 312 are understood to show respective phasor diagrams of the IQ baseband components 114 for the respective baseband frequency offsets of the graphs 302, 304, 306. Ideally, the shape of the graphs 308, 310, 312 are circular, with the amplitudes of the IQ baseband components 114 being equal, and the IQ baseband components 114 being 90° out of phase. However, due to the leakage component 103-3 the shape of the graphs 308, 310, 312 are ellipses which change shape as the leakage component 103-3 shifts relative to the carrier signal 103-1 as the baseband frequency offset changes.

In general, assuming that the operating baseband frequency offset is at −11.4 kHz, as in the graph 302, the filter coefficients 131 may be to correct the phasor diagram of the graph 308 to be circular, such that the IQ baseband components 114 are equal, 90° out of phase.

Figure 4:
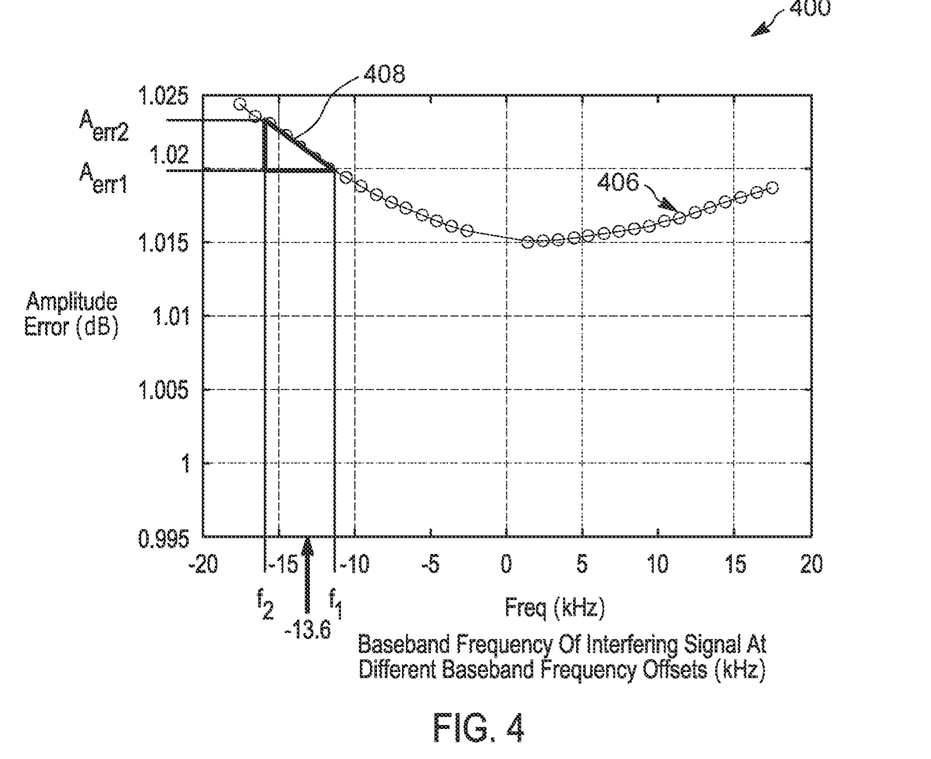
FIG. 4 depicts a determination of an amplitude ratio error gradient which is used to determine an amplitude coefficient (e.g., amplitude equalizer filter coefficient) to assist in correcting in-phase and quadrature phase baseband components to drive a speaker.

Attention is next directed to FIG. 4, which depicts a graph 400 of amplitude ratio error as a function of baseband frequencies of the interfering signal 103-2 (in kHz) for different baseband frequency offsets. It is assumed in the graph 400 that, for a given baseband frequency offset of −11.4 (e.g. an operating baseband frequency offset) that the interfering signal 103-2 is at about −13.6 kHz. The different baseband frequencies where the interfering signal 103-2 are located may be achieved through the control of the baseband frequency offsets of the local oscillator 116 as described herein.

It is understood that the graph 400 further shows a plurality of amplitude ratio error measurements 406, measured over a given baseband frequency range, for example −20 kHz to +20 kHz (e.g. that includes the baseband frequency ranges of the carrier signal 103-1, the interfering signal 103-2 and the leakage component 103-3), with each circle corresponding to a measurement. It is further understood that the IQME 120 may perform filtering of the IQ baseband components 114 over this same given baseband frequency range. It is further understood that such measurements are shown only to indicate a shape of the amplitude ratio error as a function of baseband frequencies of the interfering signal 103-2 (e.g. at the different baseband frequency offsets) and not all the measurements may occur at the device 100 (e.g. due to the required processing power).

Rather, from the graph 400, it is apparent that a shape of the amplitude ratio error as a function of baseband frequencies may be modelled as being generally linear around the baseband frequency of the interfering signal 103-2 of −13.6 kHz (e.g. for the operating baseband frequency offset). As such, the device 100 (e.g. the IQIE 122) may measure amplitude ratio error, $Aerr_1$ and $Aerr_2$ at two baseband frequency offsets (e.g. −13.4 kHz and −9.4 kHz) which correspond to the depicted respective baseband frequencies $f_1$ and $f_2$ of the interferer signal 103-2 (e.g. of −11.6 kHz and −15.6 kHz), and determine, for example using Equation (1), the gradient dAerr/df for the operating baseband frequency offset (e.g. when the interfering signal 103-2 is at −13.6 hKz). Indeed, the depicted triangle 408 is understood to represent the determination of the gradient dAerr/df using Equation (1). The amplitude ratio error may be measured only for the two baseband frequency offsets at which the interferer signal 103-2 is at baseband frequencies $f_1$ and $f_2$, and not at other baseband frequency offsets and/or other interferer signal baseband frequencies.

Alternatively, the device 100 (e.g. the IQIE 122) may measure amplitude ratio error at more than two baseband frequency offsets and/or for more than two corresponding frequencies of the interferer signal 103-2, and generate a higher order (e.g. of "2" or higher) polynomial function for the operating baseband frequency offset.

Figure 5:
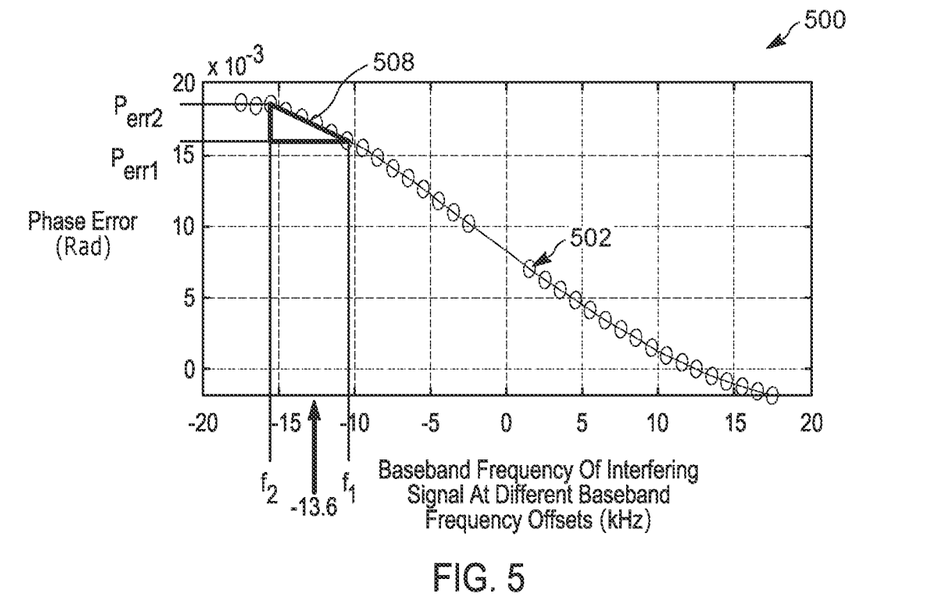
FIG. 5 depicts a determination of a phase error gradient which is used to determine a fractional time delay and/or a phase coefficient (e.g., phase equalizer filter coefficient) to assist in correcting in-phase and quadrature phase baseband components to drive a speaker.

Attention is next directed to FIG. 5 depicts a graph 500 of phase error (in radians) as a function of baseband frequencies of the interfering signal 103-2 (in kHz) for different baseband frequency offsets. Similar to FIG. 4, it is assumed that, for a given baseband frequency offset of −11.4 (e.g. an operating baseband frequency offset) that the interfering signal 103-2 is at about −13.6 kHz. The different baseband frequencies where the interfering signal 103-2 are located may be achieved through the control of the baseband frequency offsets of the local oscillator 116 as described herein.

It is understood that the graph 500 further shows a plurality of phase error measurements 502, measured over a given baseband frequency range, for example −20 kHz to +20 kHz (e.g. that includes the baseband frequency ranges of the carrier signal 103-1, the interfering signal 103-2 and the leakage component 103-3), with each circle corresponding to a measurement. However, it is understood that such measurements are shown only to indicate a shape of the phase error as a function of baseband frequencies of the interfering signal 103-2 (e.g. at the different baseband frequency offsets) and not all the measurements may occur at the device 100 (e.g. due to the required processing power).

Rather, from the graph 500, it is apparent that a shape of the phase error as a function of baseband frequencies may be modelled as being generally linear around the baseband frequency of the interfering signal 103-2 of −13.6 kHz (e.g. for the operating baseband frequency offset). As such, the device 100 (e.g. the IQIE 122) may measure phase error, $Perr_1$ and $Perr_2$ at respective baseband frequencies $f_1$ and $f_2$ in the baseband frequency range 404, such as −11.6 kHz and −15.6 kHz, and determine, for example using Equation (3), the gradient dPerr/df for the operating baseband frequency offset (e.g. when the interfering signal 103-2 is at −13.6 hKz). Indeed, the depicted triangle 508 is understood to represent the determination of the gradient dPerr/df using Equation (3). The phase error may be measured only for the two baseband frequency offsets at which the interferer signal 103-2 is at baseband frequencies $f_1$ and $f_2$, and not at other baseband frequency offsets and/or other interferer signal baseband frequencies.

Alternatively, the device 100 (e.g. the IQIE 122) may measure phase error, at more than two baseband frequency offsets and/or for more than two corresponding frequencies of the interferer signal 103-2, and generate a higher order (e.g. of "2" or higher) polynomial function for the operating baseband frequency offset.

It is understood that the gradients dAerr/df, dPerr/df, and means <Aerr>, <Perr> which describe the amplitude error as linear function of baseband frequency and the phase error as linear function of baseband frequency may be provided to the coefficient generator 124. The coefficient generator 124 may uses the gradient dAerr/df and mean <Aerr> to determine an amplitude coefficient which is used by the amplitude equalizer 126 to compensate for amplitude; an amplitude coefficient as referred to herein may hence alternatively be referred to as an amplitude equalizer filter coefficient (e.g., as the amplitude equalizer 126 filters the IQ components 114 to compensate for amplitude). For example, as the gradient dAerr/df and mean <Aerr> describe linear variations of amplitude ratio error over the baseband frequency range from $f_1$ to $f_2$, the gradient dAerr/df and mean <Aerr> may be used to adjust the amplitude of the in-phase component and/or the quadrature component until they are equal, when the local oscillator 116 is at the operating baseband frequency. Hence, in some examples, a gradient dAerr/df and/or mean <Aerr> themselves may comprise an amplitude coefficient (e.g. or amplitude coefficients) provided to the IQME 120.

Similarly, the coefficient generator 124 may uses the gradient dPerr/df to determines a time delay, and/or a fractional time delay, which is used by the phase equalizer 128 to compensate for phase. For example, a fractional time delay, Tdelay, may be determined from:

$$T\text{delay} = (dPerr/df)/(2\pi)*Fs \qquad \text{Equation (5)}$$

where Fs is a sampling frequency at which the IQ baseband components 114 are digitized, for example by the ADC 112; alternatively the sampling frequency Fs may comprise a frequency at which the IQIE 122 samples the IQ baseband components 114 received from the ADC 112. Such a fractional time delay, Tdelay, and mean phase error <Perr> may comprise a phase coefficient (e.g. or phase coefficients) provided to the IQME 120 by the coefficient generator 124; a phase coefficient as referred to herein may hence alternatively be referred to as a phase equalizer filter coefficient (e.g., as the phase equalizer 128 filters the IQ components 114 to compensate for phase differences that are not 90°).

Hence, the IQ baseband components 114 are filtered using the filter coefficients 131 to generate the corrected IQ baseband components 132, which may be further filtered and/or corrected etc. by the equalizer tuning components 130 to generate the output 133 that drives the speaker 138.

As should be apparent from this detailed description above, the operations and functions of electronic computing devices described herein are sufficiently complex as to require their implementation on a computer system, and cannot be performed, as a practical matter, in the human mind. Electronic computing devices such as set forth herein are understood as requiring and providing speed and accuracy and complexity management that are not obtainable by human mental steps, in addition to the inherently digital nature of such operations (e.g., a human mind cannot receive RF signals nor convert such signals to IQ baseband components and the like).

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "one of", without a more limiting modifier such as "only one of", and when applied herein to two or more subsequently defined options such as "one of A and B" should be construed to mean an existence of any one of the options in the list alone (e.g., A alone or B alone) or any combination of two or more of the options in the list (e.g., A and B together). Similarly the terms "at least one of" and "one or more of", without a more limiting modifier such as "only one of", and when applied herein to two or more subsequently defined options such as "at least one of A or B", or "one or more of A or B" should be construed to mean an existence of any one of the options in the list alone (e.g., A alone or B alone) or any combination of two or more of the options in the list (e.g., A and B together).

A device or structure that is "configured" in a certain way is configured in at least that way, but may also be configured in ways that are not listed.

The terms "coupled", "coupling" or "connected" as used herein can have several different meanings depending on the context in which these terms are used. For example, the terms coupled, coupling, or connected can have a mechanical or electrical connotation. For example, as used herein, the terms coupled, coupling, or connected can indicate that two elements or devices are directly connected to one another or connected to one another through intermediate elements or devices via an electrical element, electrical signal or a mechanical element depending on the particular context.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Any suitable computer-usable or computer readable medium may be utilized. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. In the context of this document, a computer-usable or computer-readable medium may be any medium that can contain, store, communicate, propagate, or transport the program for use by or in connection with the instruction execution system, apparatus, or device.

Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. For example, computer program code for carrying out operations of various example embodiments may be written in an object oriented programming language such as Java, Smalltalk, C++, Python, or the like. However, the computer program code for carrying out operations of various example embodiments may also be written in conventional procedural programming languages, such as the "C" programming language or similar programming languages. The program code may execute entirely on a computer, partly on the computer, as a stand-alone software package, partly on the computer and partly on a remote computer or server or entirely on the remote computer or server. In the latter scenario, the remote computer or server may be connected to the computer through a local area network (LAN) or a wide area network (WAN), or the connection may be made to an external computer (for example, through the Internet using an Internet Service Provider).

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method comprising:
controlling, via one or more processors of a radio-frequency (RF) receiver, a local oscillator of an RF downmixing device to a plurality of baseband frequency offsets over a range that includes a given baseband frequency offset;
determining, via the one or more processors, at the plurality of baseband frequency offsets, amplitude ratio error and phase error for respective in-phase and quadrature phase (IQ) baseband components of a received RF signal;
generating, via the one or more processors, filter coefficients for a given baseband frequency range which compensates for respective amplitude ratio error and respective phase error for the given baseband frequency range, the filter coefficients generated using the amplitude ratio error and the phase error for the respective IQ baseband components; and
filtering, via the one or more processors, with the filter coefficients, IQ baseband components of the received RF signal, with the local oscillator operating at the given baseband frequency offset, to generate corrected IQ baseband components,
wherein one or more of determining the amplitude ratio error and the phase error, and generating the filter coefficients occurs periodically.

2. The method of claim 1, further comprising generating, using the corrected IQ baseband components, output to drive a speaker.

3. The method of claim 1, wherein the given baseband frequency offset comprises an operating baseband frequency offset of the RF receiver, and the given baseband frequency range comprises an operating baseband frequency range that is defined, at least in part, by the operating baseband frequency offset.

4. The method of claim 1, wherein the given baseband frequency range corresponds to frequencies of a carrier signal and an interfering signal of the received RF signal processed to the given baseband frequency range by the RF downmixing device using a reference frequency of the local oscillator and the plurality of baseband frequency offsets.

5. The method of claim 1, further comprising:
determining the amplitude ratio error and the phase error at two baseband frequency offsets on either side of the given baseband frequency offset;
using the amplitude ratio error and the phase error at the two baseband frequency offsets to determine respective linear equations for the amplitude ratio error and the phase error; and
generating the filter coefficients for the given baseband frequency offset using the respective linear equations.

6. The method of claim 1, further comprising:
determining the amplitude ratio error and the phase error at three or more baseband frequency offsets in the range that includes the given baseband frequency offset;
using the amplitude ratio error and the phase error at the three or more baseband frequency offsets to determine respective polynomial equations for the amplitude ratio error and the phase error; and
generating the filter coefficients for the given baseband frequency offset using the respective polynomial equations.

7. The method of claim 1, wherein the received RF signal comprises a carrier signal and an interfering signal, and wherein one or more of determining the amplitude ratio error and the phase error, and generating the filter coefficients, occurs when power of the carrier signal is smaller than a threshold power and respective power of the interfering signal is greater than a respective threshold power,
wherein the power of one or more of the carrier signal and the respective power of the interfering signal are determined at given frequencies using one or more bandpass filters.

8. The method of claim 1, wherein the received RF signal comprises a carrier signal and an interfering signal, and wherein one or more of determining the amplitude ratio error and the phase error, and generating the filter coefficients occurs, when the interfering signal is at a threshold frequency distance from the carrier signal.

9. The method of claim 1, wherein the filter coefficients are to respectively equalize the amplitude ratio error and the phase error of the corrected IQ baseband components.

10. A device comprising:
an RF receiver configured to receive radio-frequency (RF) signals;
an RF downmixing device;
a local oscillator of the RF downmixing device; and
one or more processors configured to:
control the local oscillator of the RF downmixing device to a plurality of baseband frequency offsets over a range that includes a given baseband frequency offset;
determine, at the plurality of baseband frequency offsets, amplitude ratio error and phase error for respective in-phase and quadrature phase (IQ) baseband components of a received RF signal;
generate, using the amplitude ratio error and the phase error for the respective IQ baseband components, filter coefficients for a given baseband frequency range which compensates for respective amplitude ratio error and respective phase error for the given baseband frequency range; and
filter, with the filter coefficients, IQ baseband components of the received RF signal, with the local oscillator operating at the given baseband frequency offset, to generate corrected IQ baseband components,
wherein the one or more processors are further configured to determine the amplitude ratio error and the phase error, and generate the filter coefficients, periodically.

11. The device of claim 10, wherein the one or more processors are further configured to generate, using the corrected IQ baseband components, output to drive a speaker.

12. The device of claim 10, wherein the given baseband frequency offset comprises an operating baseband frequency offset of the RF receiver, and the given baseband frequency range comprises an operating baseband frequency range that is defined, at least in part, by the operating baseband frequency offset.

13. The device of claim 10, wherein the given baseband frequency range corresponds to frequencies of a carrier signal and an interfering signal of the received RF signal processed to the given baseband frequency range by the RF downmixing device using a reference frequency of the local oscillator and the plurality of baseband frequency offsets.

14. The device of claim 10, wherein the one or more processors are further configured to:
   determine the amplitude ratio error and the phase error at two baseband frequency offsets on either side of the given baseband frequency offset;
   use the amplitude ratio error and the phase error at the two baseband frequency offsets to determine respective linear equations for the amplitude ratio error and the phase error; and
   generate the filter coefficients for the given baseband frequency offset using the respective linear equations.

15. The device of claim 10, wherein the one or more processors are further configured to:
   determine the amplitude ratio error and the phase error at three or more baseband frequency offsets in the range that includes the given baseband frequency offset;
   use the amplitude ratio error and the phase error at the three or more baseband frequency offsets to determine respective polynomial equations for the amplitude ratio error and the phase error; and
   generate the filter coefficients for the given baseband frequency offset using the respective polynomial equations.

16. The device of claim 10, wherein the received RF signal comprises a carrier signal and an interfering signal, and wherein the one or more processors are further configured to one or more of determine the amplitude ratio error and the phase error, and generate the filter coefficients, when power of the carrier signal is smaller than a threshold power and respective power of the interfering signal is greater than a respective threshold power,
   wherein the one or more processors are further configured to determine the power of one or more of the carrier signal and the respective power of the interfering signal at given frequencies using one or more bandpass filters.

17. The device of claim 10, wherein the received RF signal comprises a carrier signal and an interfering signal, and
   wherein the one or more processors are further configured to one or more of determine the amplitude ratio error and the phase error, and generate the filter coefficients, when the interfering signal is at a threshold frequency distance from the carrier signal.

18. The device of claim 10, wherein the filter coefficients are to respectively equalize the amplitude ratio error and the phase error of the corrected IQ baseband components.

19. A method comprising:
   controlling, via one or more processors of a radio-frequency (RF) receiver, a local oscillator of an RF downmixing device to a plurality of baseband frequency offsets over a range that includes a given baseband frequency offset;
   determining, via the one or more processors, at the plurality of baseband frequency offsets, amplitude ratio error and phase error for respective in-phase and quadrature phase (IQ) baseband components of a received RF signal;
   generating, via the one or more processors, filter coefficients for a given baseband frequency range which compensates for respective amplitude ratio error and respective phase error for the given baseband frequency range, the filter coefficients generated using the amplitude ratio error and the phase error for the respective IQ baseband components; and
   filtering, via the one or more processors, with the filter coefficients, IQ baseband components of the received RF signal, with the local oscillator operating at the given baseband frequency offset, to generate corrected IQ baseband components,
   wherein the received RF signal comprises a carrier signal and an interfering signal, and wherein one or more of determining the amplitude ratio error and the phase error, and generating the filter coefficients, occurs:
      when power of the carrier signal is smaller than a threshold power and respective power of the interfering signal is greater than a respective threshold power, the power of one or more of the carrier signal and the respective power of the interfering signal determined at given frequencies using one or more bandpass filters; or
      when the interfering signal is at a threshold frequency distance from the carrier signal.

* * * * *